(12) United States Patent
Iadanza et al.

(10) Patent No.: US 7,710,302 B2
(45) Date of Patent: May 4, 2010

(54) DESIGN STRUCTURES AND SYSTEMS INVOLVING DIGITAL TO ANALOG CONVERTERS

(75) Inventors: Joseph A. Iadanza, Hinesburg, VT (US); Benjamin T. Voegeli, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 11/962,276

(22) Filed: Dec. 21, 2007

(65) Prior Publication Data

US 2009/0160689 A1   Jun. 25, 2009

(51) Int. Cl.
*H03M 1/78* (2006.01)
(52) U.S. Cl. .................. 341/154; 341/144; 341/145
(58) Field of Classification Search ............ 341/144, 341/154, 145
See application file for complete search history.

(56) References Cited

U.S. PATENT DOCUMENTS

| | | | |
|---|---|---|---|
| 3,581,303 A | 5/1971 | Kelly | |
| 3,646,587 A | 2/1972 | Shaffstall et al. | |
| 3,877,021 A | 4/1975 | Raamot | |
| 4,415,881 A | 11/1983 | Lechner et al. | |
| 5,045,832 A | 9/1991 | Tam | |
| 5,059,978 A | 10/1991 | Valdenaire | |
| 5,495,245 A | 2/1996 | Ashe | |
| 5,568,147 A | 10/1996 | Matsuda et al. | |
| 5,648,780 A * | 7/1997 | Neidorff | 341/154 |
| 5,703,588 A * | 12/1997 | Rivoir et al. | 341/159 |
| 5,940,020 A * | 8/1999 | Ho | 341/145 |
| 5,969,658 A | 10/1999 | Naylor | |
| 5,977,897 A | 11/1999 | Barnes et al. | |
| 5,977,898 A * | 11/1999 | Ling et al. | 341/144 |
| 6,037,889 A | 3/2000 | Knee | |
| 6,054,884 A | 4/2000 | Lye | |
| 6,163,288 A | 12/2000 | Yoshizawa | |
| 6,169,510 B1 | 1/2001 | Bult et al. | |
| 6,181,265 B1 * | 1/2001 | Lee | 341/145 |
| 6,204,789 B1 | 3/2001 | Nagata | |
| 6,225,929 B1 | 5/2001 | Beck | |
| 6,388,599 B2 | 5/2002 | Yamamoto et al. | |
| 6,407,692 B1 | 6/2002 | Bult et al. | |
| 6,414,616 B1 | 7/2002 | Dempsey | |
| 6,433,717 B1 | 8/2002 | Leung | |
| 6,621,440 B2 | 9/2003 | Gorman | |
| 6,642,877 B2 | 11/2003 | Leung | |
| 6,650,267 B2 | 11/2003 | Bult et al. | |

(Continued)

OTHER PUBLICATIONS

Notice of Allowance, U.S. Appl. No. 12/139,318, Structures for Systems and Methods of Generating an Analog Signal, Dated: Jan. 2, 2009.

*Primary Examiner*—Linh V Nguyen
(74) *Attorney, Agent, or Firm*—Cantor Colburn LLP; Riyon Harding

(57) ABSTRACT

A digital to analog converter (DAC) system comprising, a first segment, wherein a segment comprises, a first path including an array of resistors connected in series between a first reference voltage node and a second reference voltage node, wherein the array is connected to a first switch device disposed between nodes of the array and an output node, and a third path including a second resistor in series with a second switch device, wherein the third path is connected in parallel with the first path.

14 Claims, 12 Drawing Sheets

U.S. PATENT DOCUMENTS

| | | |
|---|---|---|
| 6,724,336 B2 | 4/2004 | Leung et al. |
| 6,782,499 B2 | 8/2004 | Osada et al. |
| 6,885,328 B1 | 4/2005 | Kao et al. |
| 6,914,574 B2 * | 7/2005 | Fourdeux et al. ............ 343/769 |
| 6,954,165 B2 * | 10/2005 | Mallinson ................... 341/144 |
| 6,975,261 B1 | 12/2005 | Isham |
| 6,995,701 B1 * | 2/2006 | Churchill et al. ............ 341/154 |
| 7,190,298 B2 | 3/2007 | Mulder |
| 7,250,891 B2 * | 7/2007 | Nishimura ................... 341/154 |
| 7,414,561 B1 * | 8/2008 | Brubaker ..................... 341/145 |
| 7,420,496 B2 | 9/2008 | Kim et al. |
| 7,453,385 B2 * | 11/2008 | Hino ........................ 341/145 |
| 7,532,142 B1 * | 5/2009 | Voegeli et al. .............. 341/154 |
| 2002/0030620 A1 | 3/2002 | Cairns et al. |
| 2002/0121995 A1 | 9/2002 | Tabler |
| 2002/0186231 A1 * | 12/2002 | Kudo et al. ................. 345/690 |
| 2009/0160690 A1 * | 6/2009 | Kawaguchi et al. ......... 341/154 |

* cited by examiner

US 7,710,302 B2

DESIGN STRUCTURES AND SYSTEMS INVOLVING DIGITAL TO ANALOG CONVERTERS

BACKGROUND OF THE INVENTION

1. Field of the Invention

This invention relates generally to systems and methods involving digital to analog converters, and specifically to systems and methods for operating digital and analog converters more efficiently.

2. Description of Background

Some digital to analog converters (DACs) include a network of series resistors that is disposed between a first reference (VREF1) and a second reference (VREF2). A prior art example of a DAC is shown in FIG. 1. Each of the resistors in the network is similar to the other resistors in the network. The voltage (VREF1-VREF2) is divided such that an equal voltage drop occurs across each resistor in the network. A series of analog multiplexor (MUX) devices is disposed between each of the nodes between the resistors in the network and an output node. Activation of a MUX device allows propagation of a selected voltage node from the resistor network to the DAC output (DAC Out). The DAC Out has some capacitive loading and may drive a high-swing operational amplifier to drive off-chip circuits or remain unbuffered to drive an on-chip ADC reference input.

The resistor network of FIG. 1 grows with an increasing number of bits into the incoming digital signature or address. A 2-bit resolution DAC uses 4 resistors; a 4-bit resolution DAC uses 16 resistors; an 8-bit resolution DAC uses 256 resistors and a 10-bit resolution DAC uses 1024 resistors in series. As the number of resistors grows, the total resistance of the network grows, increasing the RC time constant for charging and discharging output DAC Out as the address changes. As a result, performance of the resistor DAC is limited. With growth in resistor count, resistor tracking becomes a concern across the larger array, impacting DAC integral non linearity (INL) and differential non linearity (DNL). The size of the unit resistor in the network can be reduced, but cannot be scaled at the same rate that the number of resistors is increased. Further, decreasing the unit resistance may contribute to increased DAC INL and DNL if resistor length is decreased to decrease total resistance and will increase area if resistor width is increased to decrease total resistance of the DAC.

SUMMARY OF THE INVENTION

The shortcomings of the prior art are overcome and additional advantages are achieved through an exemplary digital to analog converter (DAC) system comprising, a first segment, wherein a segment comprises, a first path including an array of resistors connected in series between a first reference voltage node and a second reference voltage node, wherein the array is connected to a first switch device disposed: between nodes of the array and an output node, and a third path including a second resistor in series with a second switch device, wherein the third path is connected in parallel with the first path.

An exemplary method of controlling a DAC system, the method comprising, receiving a new address, determining whether a difference between the new address and a prior address is greater than or equal to a threshold value, generating a switching device selection signal, operative to output an analog signal, responsive to determining that the difference between the new address and the prior address is less than the threshold value, and generating an early cycle buffering clock signal and generating a switching device selection signal, operative to output an analog signal, responsive to determining that the difference between the new address and the prior address is greater than or equal to the threshold value.

An exemplary embodiment of a design structure embodied in a machine readable medium used in a design process, the design structure comprising, an apparatus for converting digital signals to analog signals, the apparatus including a first segment, wherein a segment comprises, a first path including an array of resistors connected in series between a first reference voltage node and a second reference voltage node, wherein the array is connected to a first switch device disposed between nodes of the array and an output node, and a third path including a second resistor in series with a second switch device, wherein the third path is connected in parallel with the first path.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Methods and systems involving digital to analog converters (DAC) are provided. Several exemplary embodiments are described.

Figure 1:
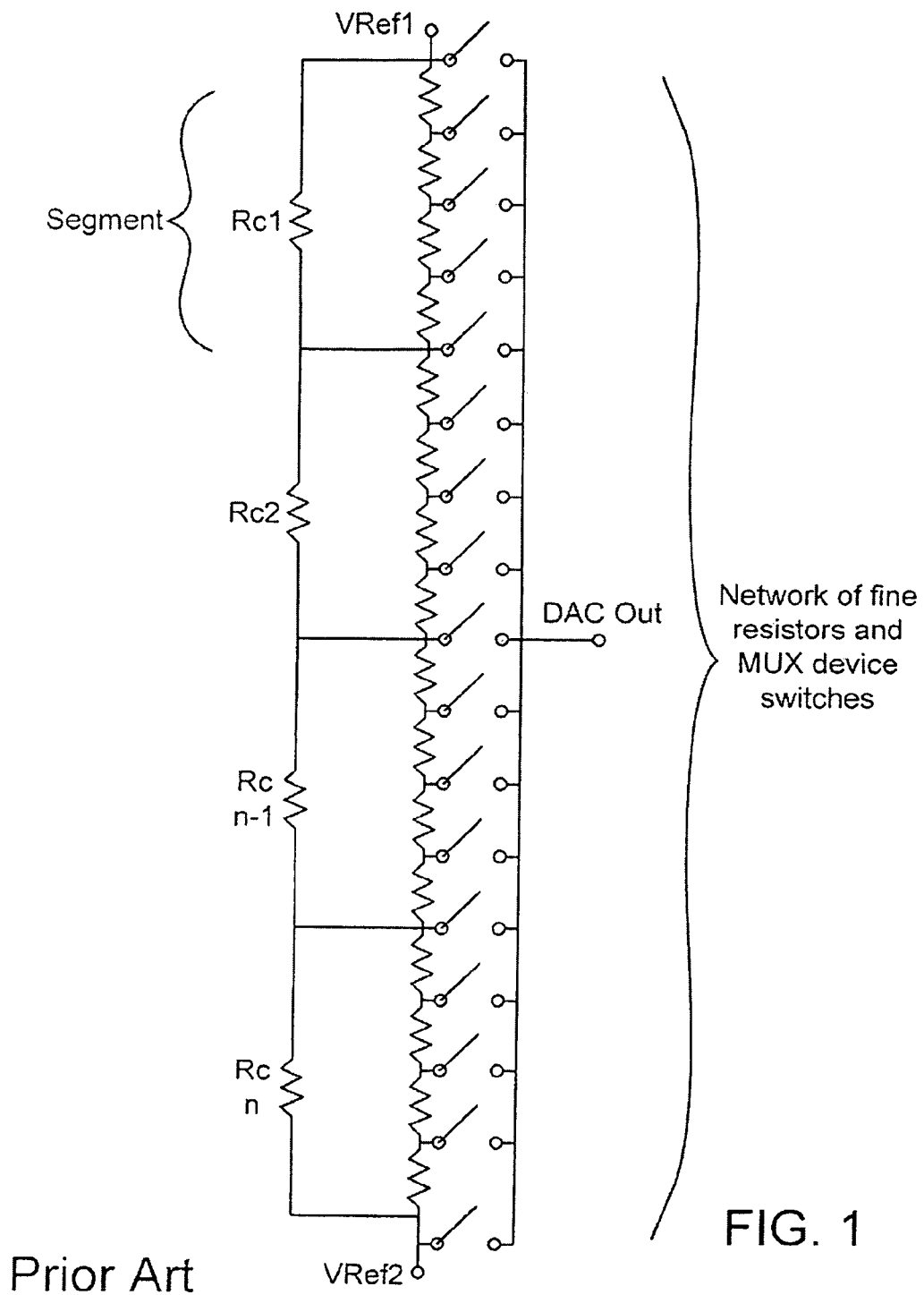
FIG. 1 illustrates a prior art example of a DAC system.

FIG. 1 includes a prior art example of a DAC having a network of resistors (a fine array) in series. The fine resistor array is sub-divided into segments. Typically each segment is divided such that the number of resistors in each segment is equal and an even power of 2. For example, a 10-bit resistor DAC with 1024 fine resistors could be divided into 64 segments of 16 resistors each. Each segment of fine resistors is connected in parallel with one or more course resistors (Rc1-Rcn) that may be of the same unit resistance value.

The number of course resistors connected in parallel with the segment is typically much less than the number of fine resistors in the segment such that the parallel combination of the course and fine resistors effectively reduces the resistance of the segment. In addition, the course resistors may be used to limit the variance of the effective resistance of each segment relative to other segments. The reduction of effective resistance comes at a minor cost because the resistor width and length do not have to be modified, and typically, the number of course resistors required adds less than twenty-five percent (25%) to the fine resistor count. With reduced effective resistance, the RC time constant of the DAC is reduced, but still may be large for DACs having 10-bits or more resolution. While performance of the array improves, reduction of the effective resistance increases the extent to which noise injected from VREF1 and VREF2 can penetrate the array.

A second electrical limit exists with regard to effective resistance reduction. The least significant bit (LSB) resistance of the DAC is essentially the parallel combination of the segment fine and course resistance divided by the number of fine resistors in the segment. The LSB resistance is the resistance across which a voltage potential equal to one LSB is dropped. As the LSB resistance is lowered, differentiation between the LSB resistance and parasitic resistances such as the wiring between VREF1 and VREF2 to chip pads is reduced. This may compress the effective range of the DAC by multiple LSBs.

Figure 2:
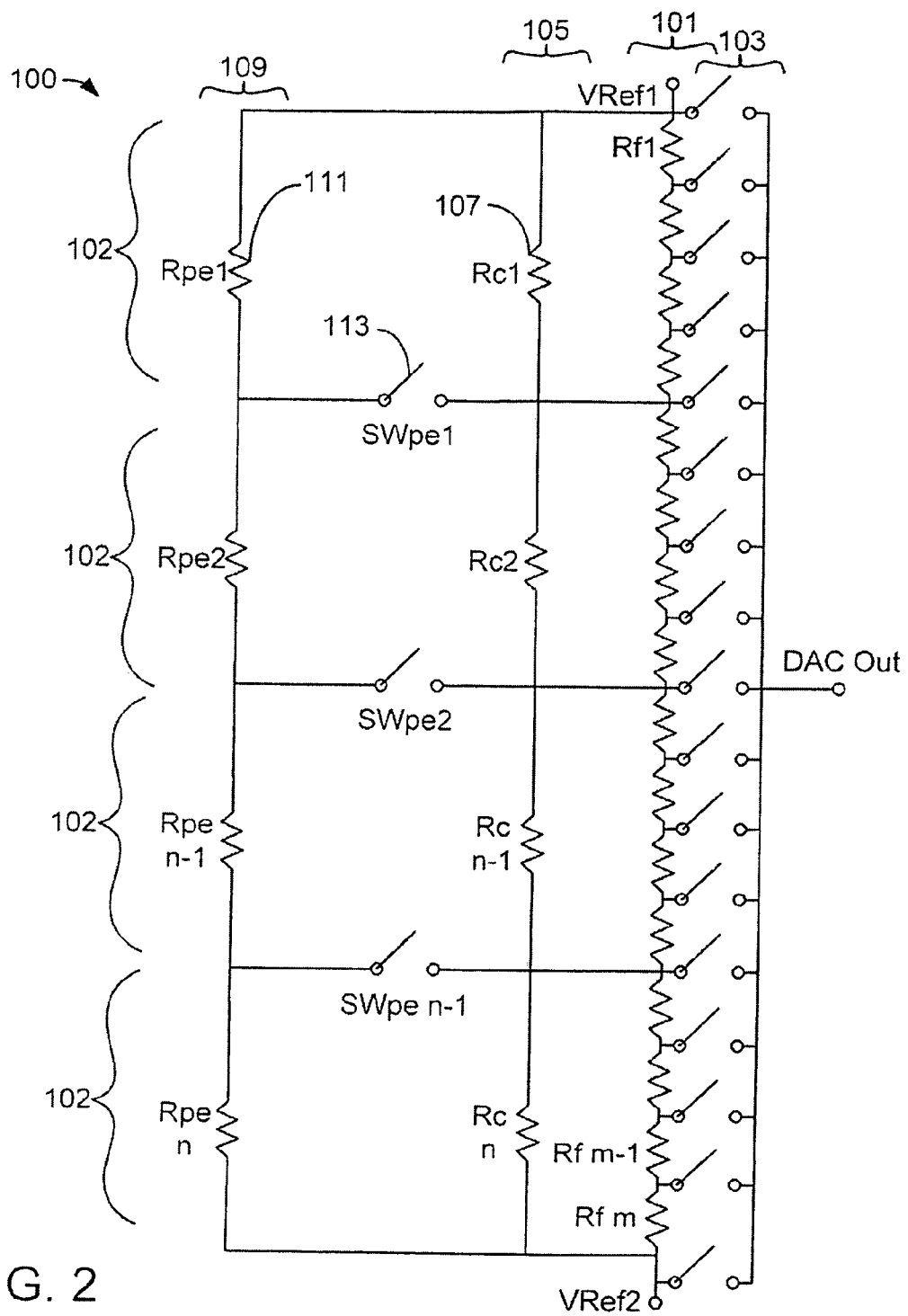
FIG. 2 illustrates an exemplary embodiment of a DAC system.

FIG. 2 illustrates an exemplary embodiment of a DAC system 100 that uses early cycle voltage buffering (PHI) including a first path 101 having a network of fine resistors (Rf) having "m" number of resistors in series between a first reference voltage (VRef1) and a second reference voltage (VRef2). The network of Rf in the first path 101 is connected at nodes between the Rfs to switches 103 of a multiplexor (MUX) or a number of MUX type devices. The network of fine resistors is divided into "n" number of segments 102. In the illustrated embodiment, the segments 102 include four fine resistors from the network of fine resistors in the first path 101, but other embodiments may include other numbers of fine resistors. A second path 105 is connected in parallel to the first path 101. Each segment 102 includes a coarse resistor (Rc) 107 in the second path 105 connected in parallel to the fine resistors in the segment 102. Other embodiments may include other numbers of course resistors. A third path 109 is also connected in parallel with the first path 101. The third path 109 includes a preemphasis resistor (Rpe) 111 and a switch (SWpe) 113 in series with Rpe 111 connected to a node of the first path 101. The n segment 102 portion of third path 109 may not include the SWpe 113.

Figure 3:
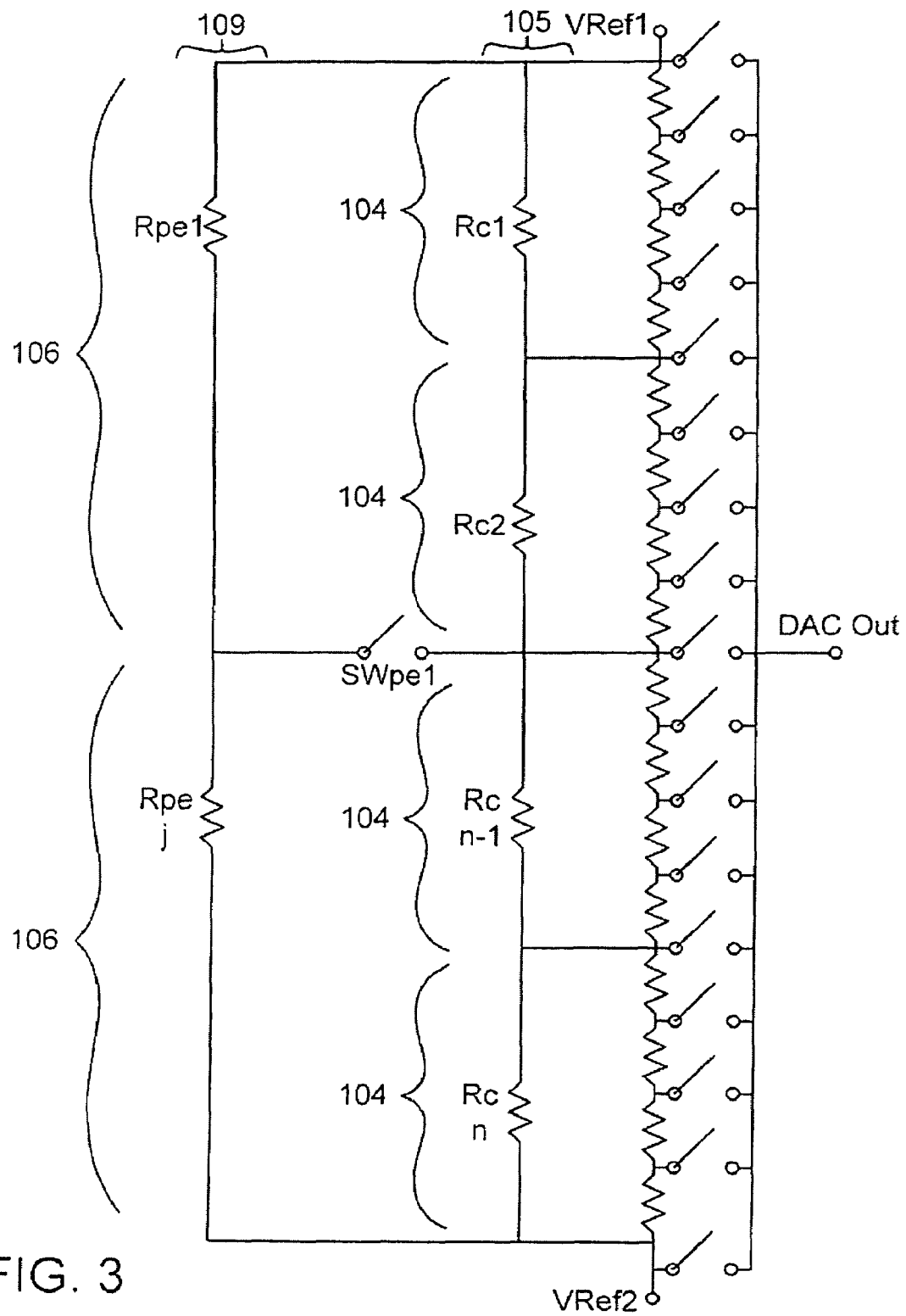
FIG. 3 illustrates an alternate exemplary embodiment of a DAC system.
Figure 11:
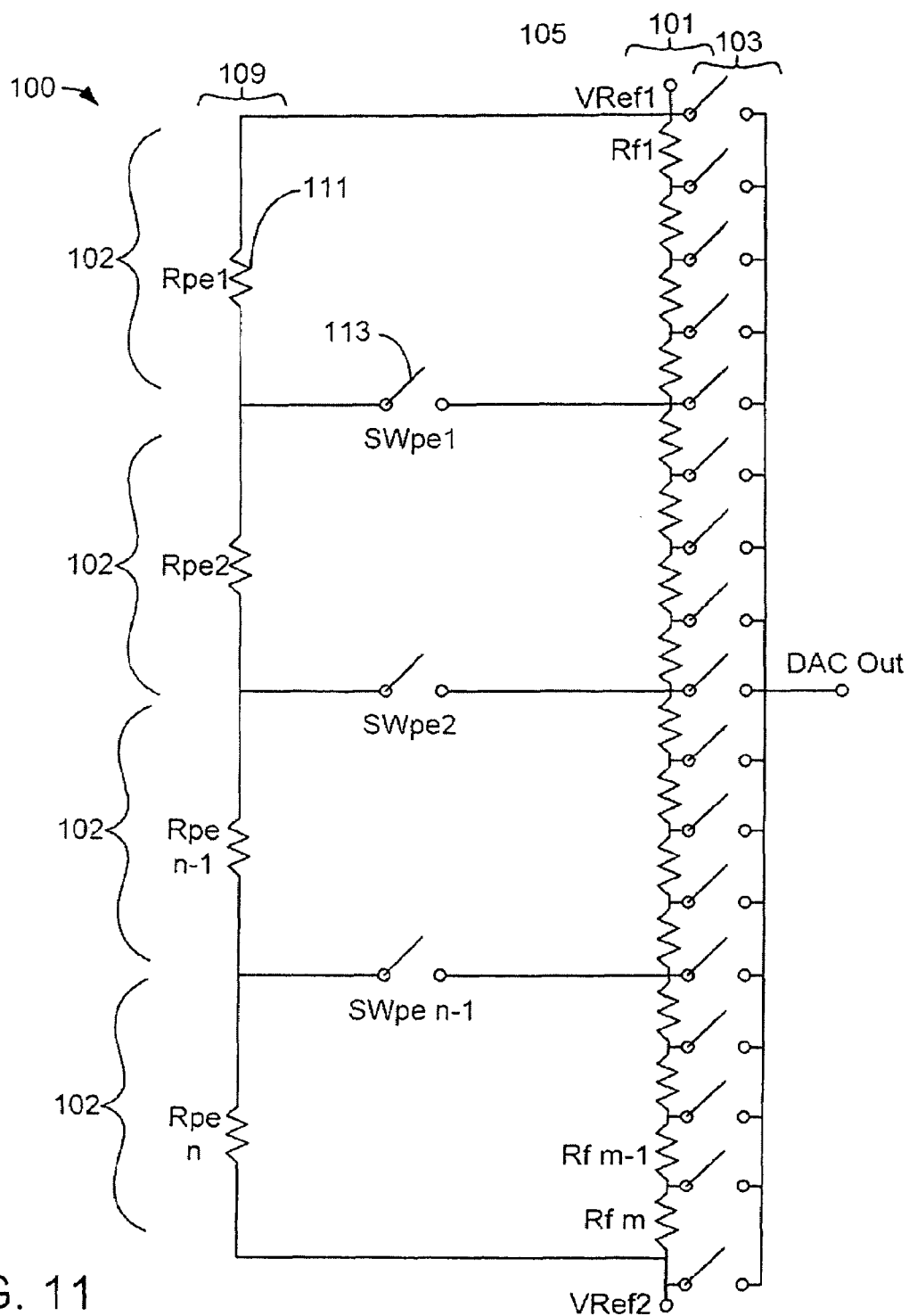
FIG. 11 illustrates another alternate exemplary embodiment of a DAC system.

In the illustrated embodiment, the third path 109 is divided into segments 102 that include the same number of Rf resistors as the segments 102 of the second path 105. However, the segments may be different sizes (i.e., the second path 105 segment may be connected in parallel with a different number of Rf resistors than the third path 109 segment.) FIG. 3 illustrates an exemplary alternate embodiment of the DAC system 100 having different segment sizes for the second path 105 (including segments 104) and the third path 109 (including segments 106). The DAC system 100 may also only include the third path 109 and not include the second path 105. An embodiment of a DAC system 100 having a third path 109 without the second path 105 is illustrated in FIG. 11.

Referring to FIG. 2, the Rf resistors are selected such that the resistance of the first path 101 is relatively high. Each of the Rpe 111 resistors are a similar resistance and may be set to a value much smaller than the Rf resistors of first path 101. In PHI operation, the SWpe 113 switches are controlled with a clock that sends a signal to a processor (not shown) that opens and closes the SWpe 113 switches at intervals. When the SWpe 113 switches are closed, the Rpe 111 resistors are in parallel with the Rf resistors in the first path 101. The switches are closed during a first portion of the DAC access cycle and opened in a second portion of the DAC access cycle. When the SWpe 113 switches are closed, the DAC initially exhibits very low LSB resistance following an address change. The lower resistance affects a faster transition time to a newly selected output voltage (as determined by the new address). Once the transition has been made, the SWpe 113 switches are opened and the DAC stabilizes. The DAC then exhibits a high LSB resistance that limits noise injection and other parasitic effects. The advantage of transitioning at a higher speed may be realized if the components in the third path 109 quickly settle the DAC to within several LSBs of the final addressed value.

Figure 4:
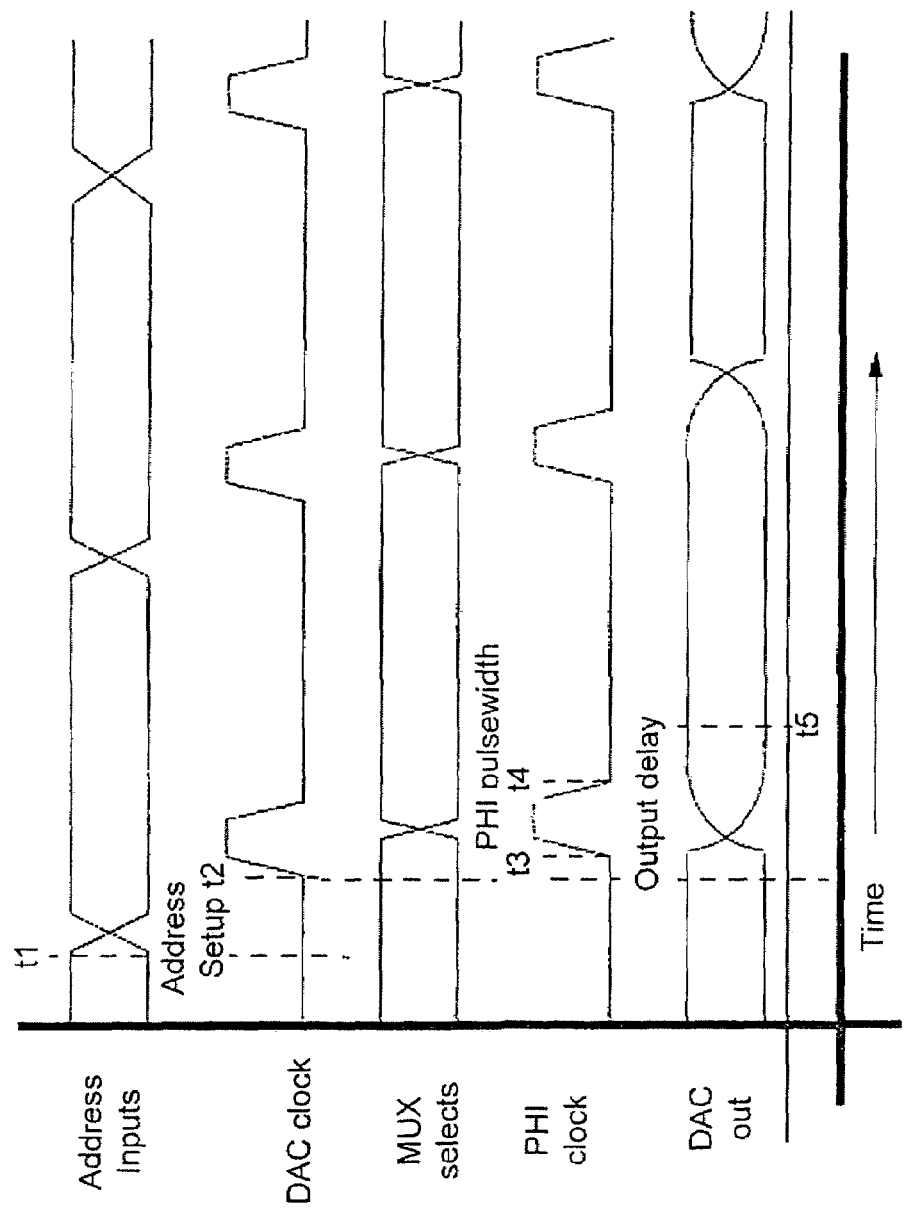
FIG. 4 illustrates an exemplary embodiment of a graph showing the operation of an embodiment of a DAC system.

FIG. 4 illustrates an exemplary graph of the operation of the DAC system 100. Address inputs are received at a time t1. A DAC clock signal is received at a time t2. When the DAC clock signal is received, the new address is decoded and subsequently MUX selections for the switches 103 (based on the received decoded address) are made. At a time t3, a PHI (early cycle voltage buffering) clock signal is received. The PHI clock signal is operative to close all of the SWpe switches 113 of DAC system 100. The DAC out shows the transition time for the selected output voltage at the DAC out node respondent to MUX selections for the switches 103. While SWpe switches 113 are closed, the low LSB resistance allows a fast transition of DAC out to approximately the selected output voltage value as determined by the address. The PHI pulse width ends at a time t4 opening SWpe switches 113. Once the SWpe switches 113 open, transition of DAC out to the selected output voltage is completed through the higher LSB resistance at time t5. The DAC clock signal and the PHI clock signal may be received from one or more clocks. The PHI pulse width is based on the output delay time for the DAC circuit and may be adjusted according to designs of the DAC.

Figure 5:
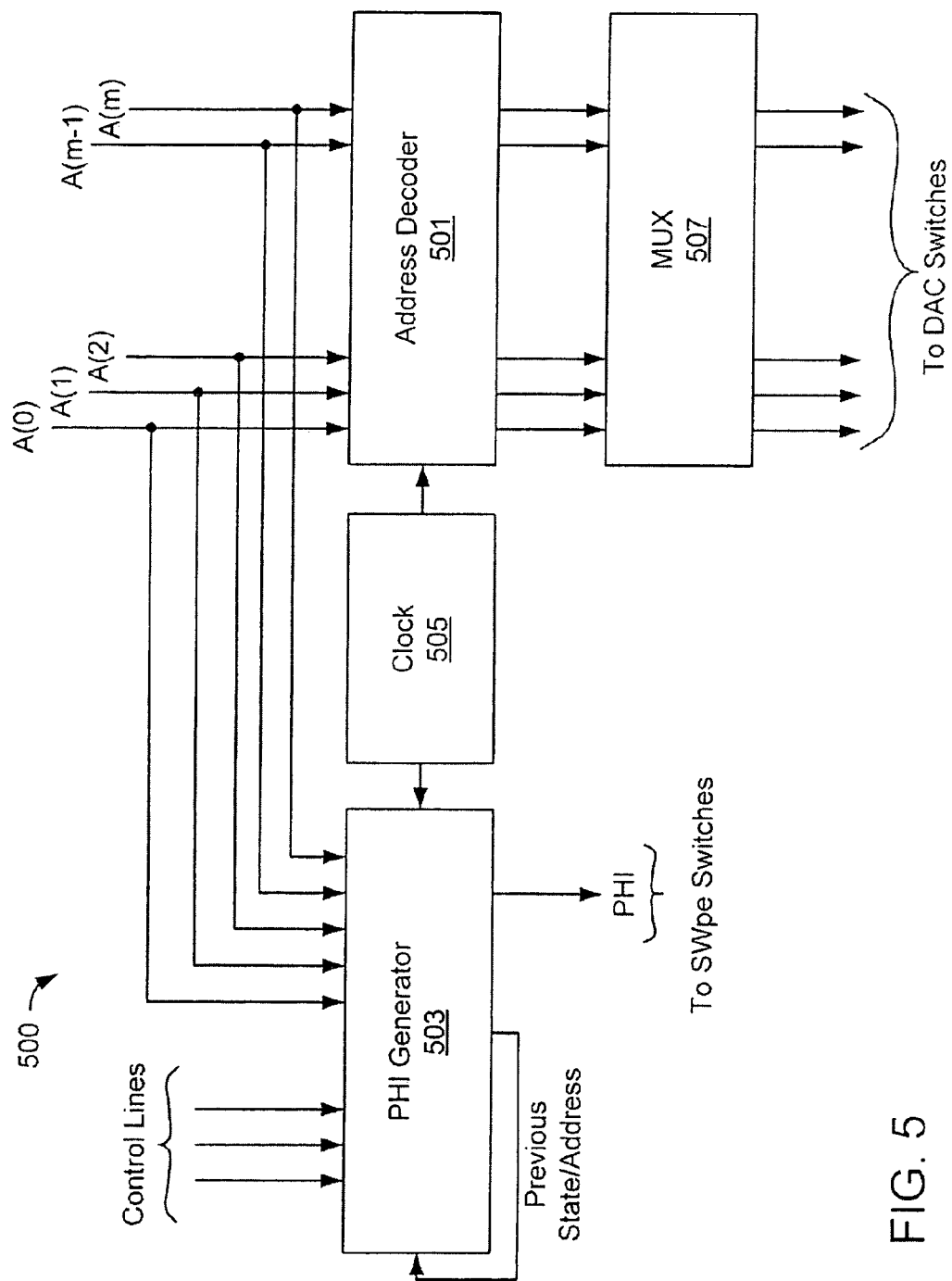
FIG. 5 illustrates an exemplary embodiment of a control portion or a DAC system.
Figure 6:
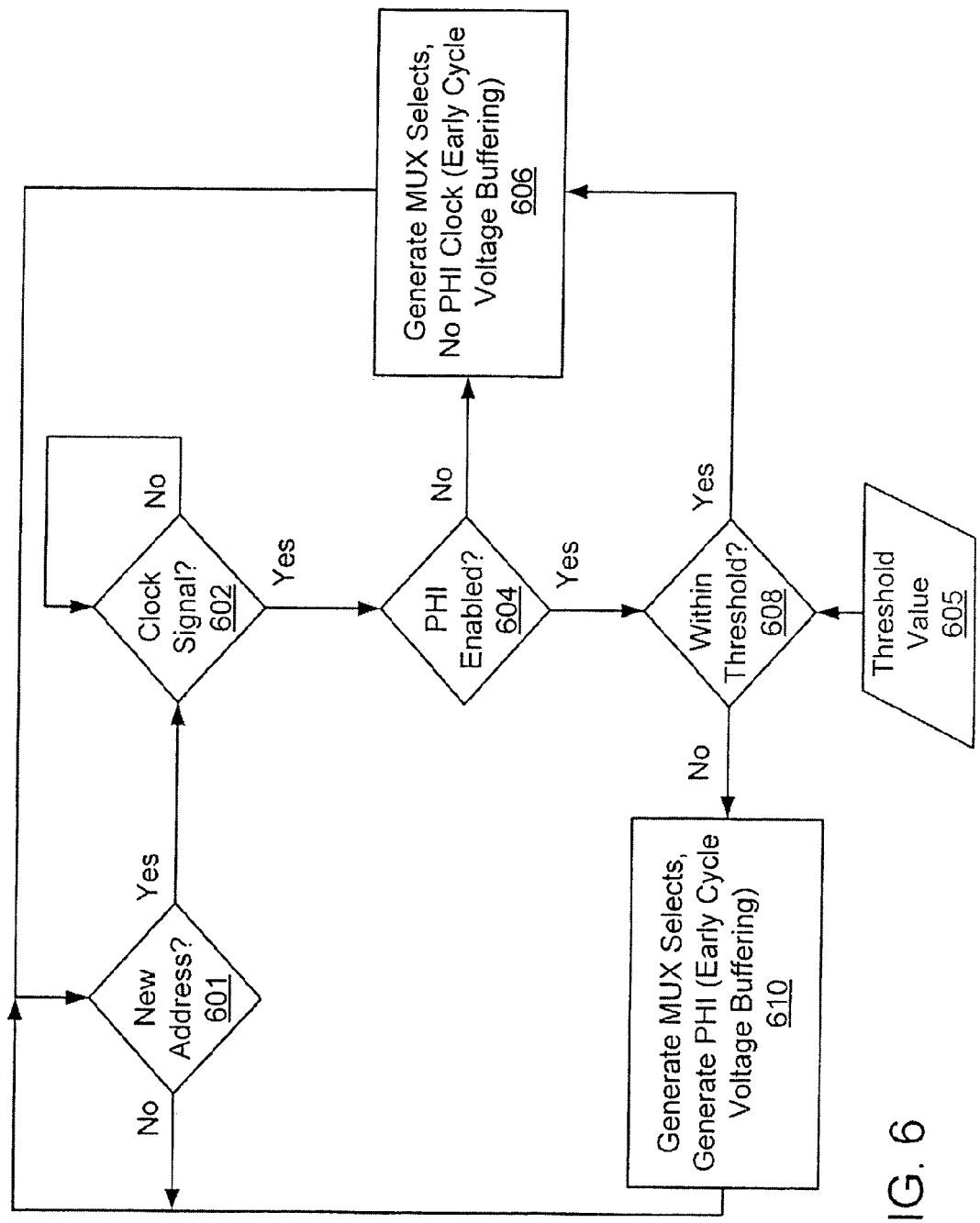
FIG. 6 illustrates a block diagram of an exemplary method for controlling a DAC system.

FIG. 5 illustrates a block diagram of an exemplary embodiment of a control portion 500 of the DAC system 100. The control portion 500 includes an address decoder 501, a PHI generator 503, and a clock 505. In operation, addresses (A(0) through A(m)) are sent to the address decoder 501. When the clock 505 sends a timing signal to the address decoder 501, the address decoder 501 decodes the address into select lines which control switches 103 (of FIG. 2), closing the switches 103 for the address provided at the address decoder 501. The clock 505 also provides a timing signal to the PHI Generator 503 that provides a PHI clock signal to the SWpe 113 switches (of FIG. 2). PHI Generator 503 may operate as a controller receiving the address, and inputs from control lines in addition to previous state and address data to selectively generate the PHI clock signal only when selected control and address conditions exist FIG. 6 illustrates a block diagram of an exemplary method of operation of the control portion 500. Referring to FIG. 6, it is determined whether a new address is received in block 601. Once a new address is received, it is determined whether a clock signal is received in block 602. In block 604 it is determined whether the PHI is enabled. If the PHI is not enabled, the address decoder 501 (of FIG. 5) generates MUX selections and the DAC system 100 converts the digital signal to an analog signal in block 606. If the PHI is enabled, the PHI generator 503 determines whether the new address is within a threshold value 605 at block 608. If the new address is within the threshold value 605, the address decoder 501 (of FIG. 5) generates MUX selects and the DAC system 100 converts the digital signal to an analog signal without activation of the PHI clock (early cycle voltage buffering) in block 606. If the new address is outside the threshold value 605, the PHI clock is generated by PHI Generator 503 (of FIG. 5) activating SWpe switches (of FIG. 2) and the address decoder 501 (of FIG. 5) generates MUX selections and the DAC system 100 converts the digital signal to an analog signal using early cycle voltage buffering in block 610.

Since some address changes may be between relatively few bits, the use of PHI may not be desired. Thus, the threshold value 605 may be used to determine whether PHI should be used for a particular new address. In block 608 the new address may be subtracted from a previous address. The result is compared to the threshold value 605. If the result is within the threshold value, the difference in the addresses is not great enough to use PHI. If the result is outside of the threshold value 605 PHI may be used. In the embodiment of FIG. 6, PHI (early cycle voltage buffering) may be enabled or disabled by a control signal as determined by block 604. Enabling of PHI allows the DAC system 100 to provide higher performance conversion while disabling PHI, allows reduction in power consumption when higher performance is not desired.

Figure 7:
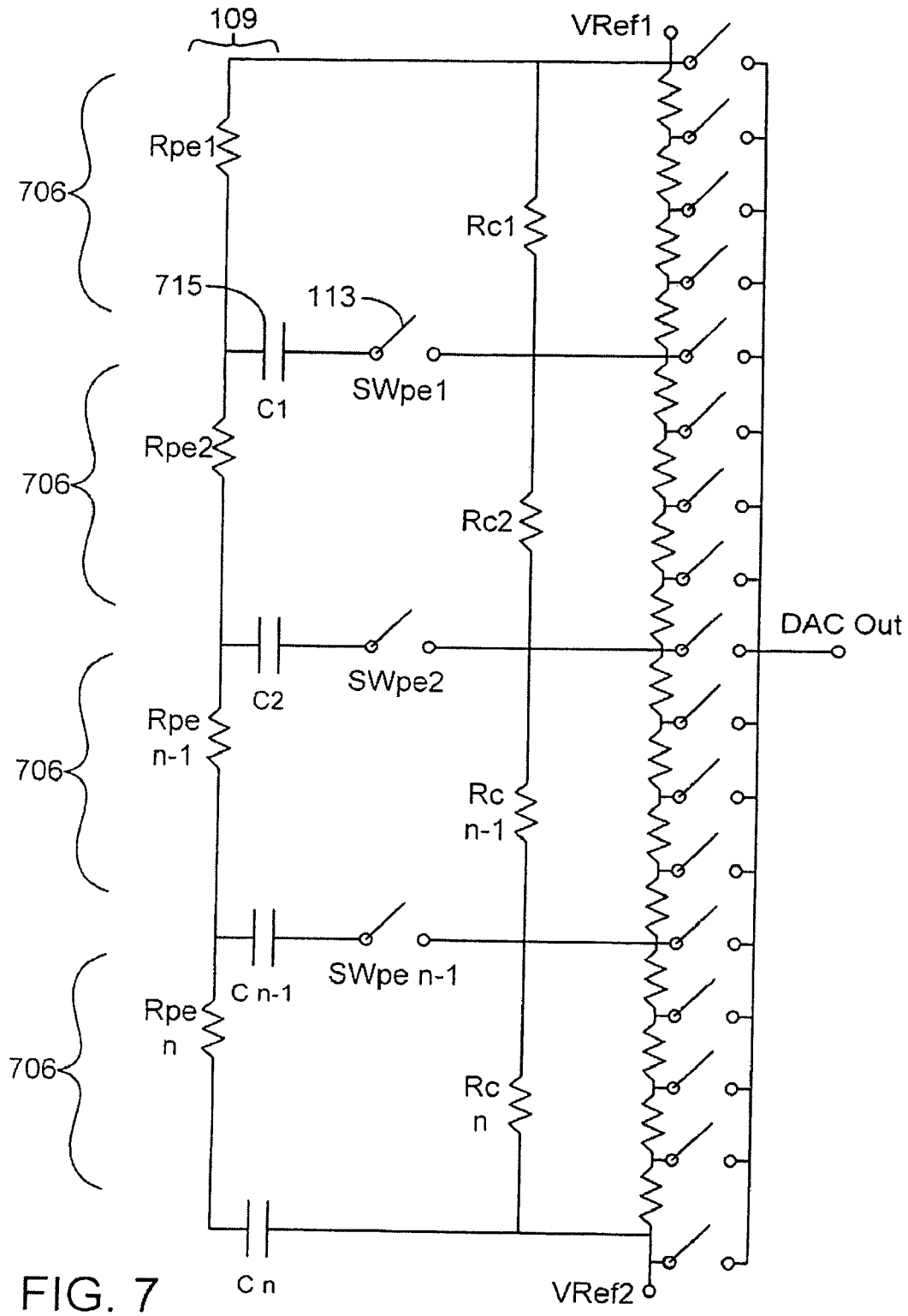
FIG. 7 illustrates another alternate exemplary embodiment of a DAC system.

FIG. 7 illustrates an alternate embodiment of the DAC system 100. In FIG. 7, the third path 109 includes a capacitor 715 in each segment 706, a second resistor first node 721 (of the second resistor Rpe1 111) and a third reference voltage, VRef3 723. The third reference voltage, VRef3 723 may be a ground voltage or any other applicable voltage value. The capacitor 715 acts to store a charge such that when the SWpe 113 switch is closed the transition time for the selected output voltage is further reduced. Capacitor 715 is charged to the desired voltage value as determined by the voltage division of Rpe in the third path 109 when switch SWpe 133 is open, and provides a charge reservoir to improve the transition time of the DAC out when the switch SWpe 113 is closed. Capacitor 715 is operative to allow the resistance value of Rpe of segment 706 to be larger than would otherwise be required to provide the necessary performance, and conserve power consumed by the third path 109. The n segment 706 portion of the third path 109 may, in some embodiments, not include a capacitor.

Figure 8:
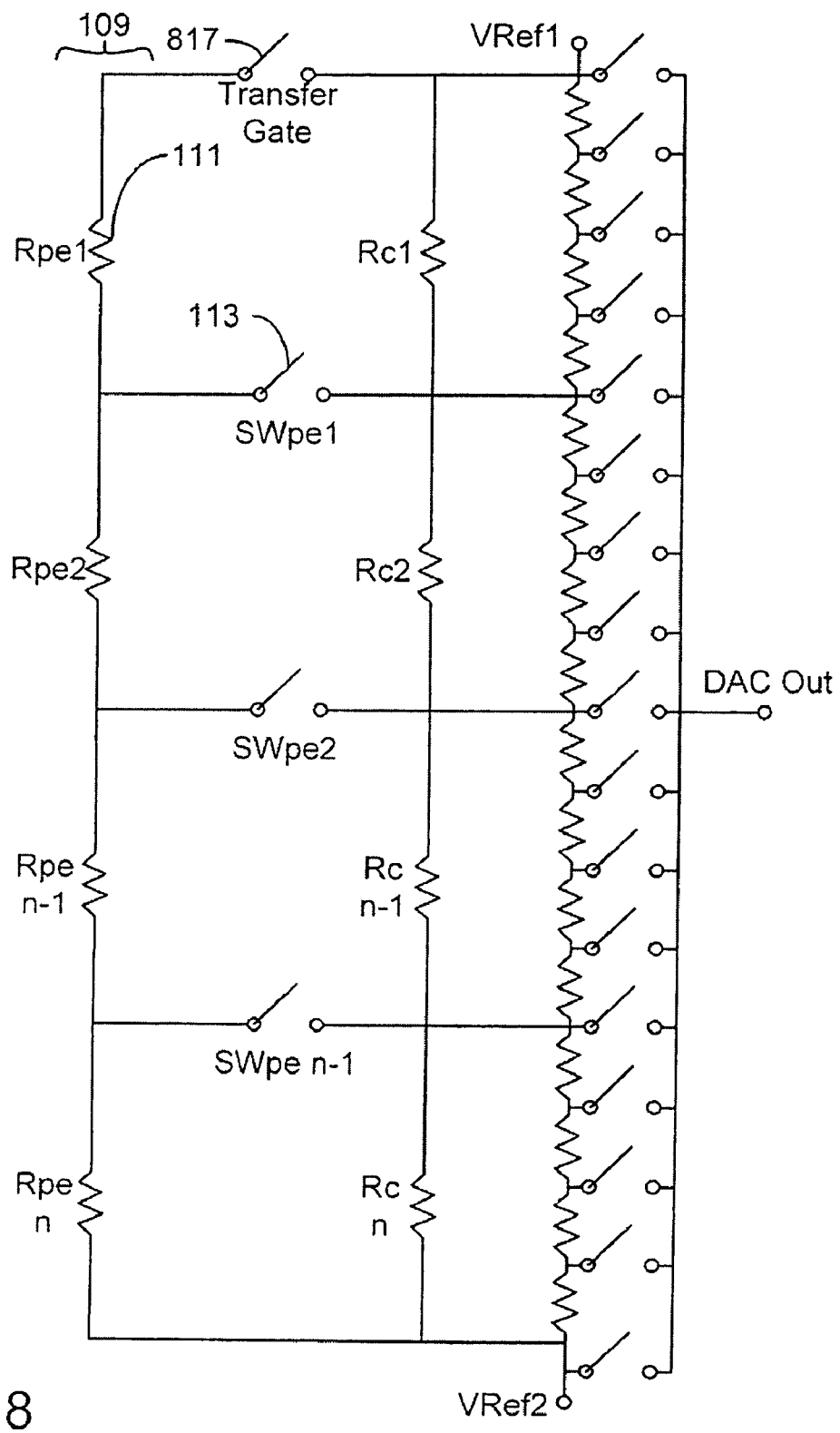
FIG. 8 illustrates another alternate exemplary embodiment of a DAC system.
Figure 12:
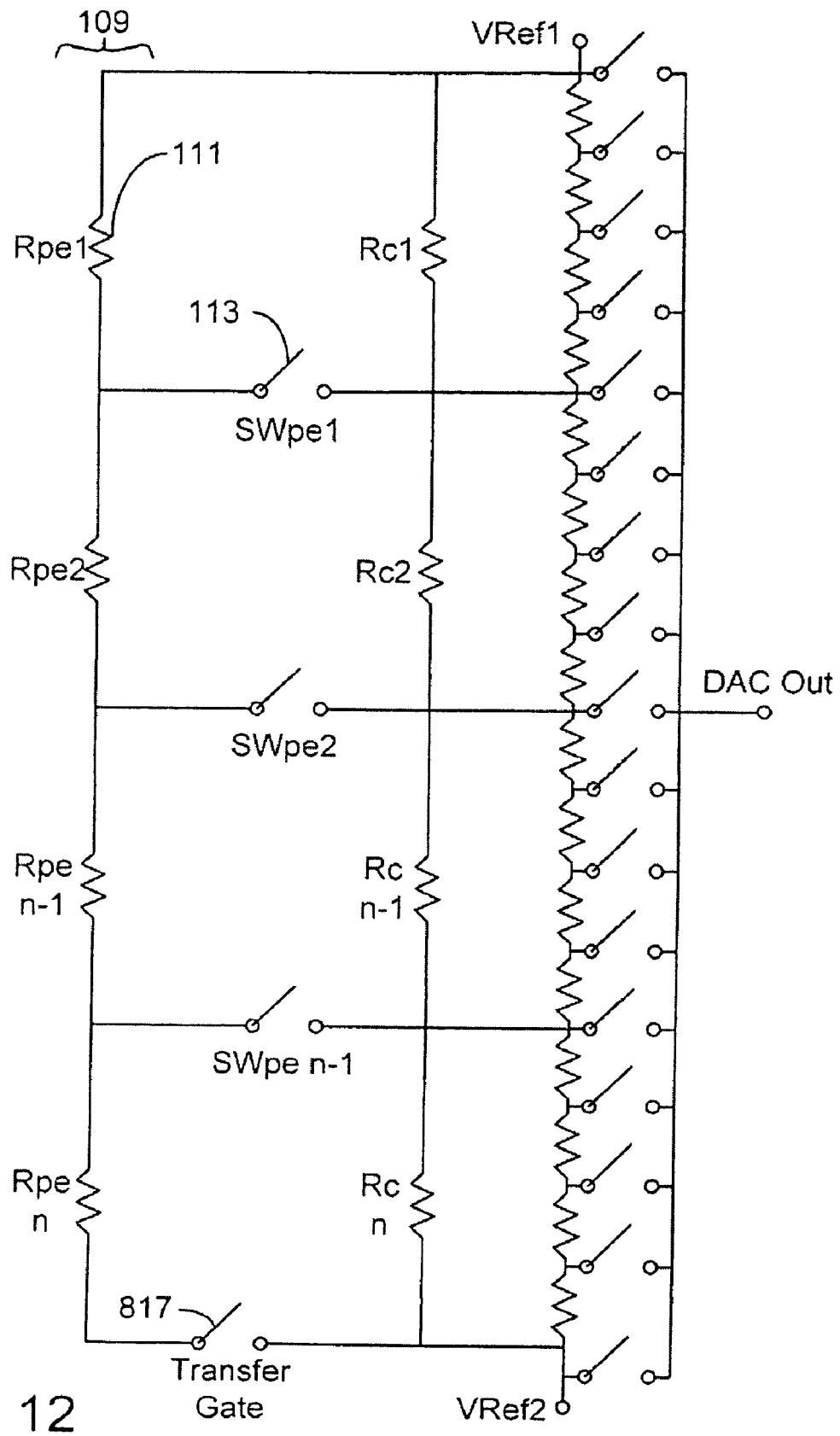
FIG. 12 illustrates another alternate exemplary embodiment of a DAC system.

FIG. 8 illustrates an alternate embodiment of the DAC system 100. In FIG. 8, the third path 109 includes a transfer gate (switch device) 817 between VRef1 and the first resistor 111 in the third path 109 (Rpe 1). The transfer gate 817 may be controlled by the PHI generator 503 (of FIG. 5). The transfer gate 817 is operative to conserve power consumed by the third path 109. The transfer gate 817 may be closed to power the third path 109 prior to closing the SWpe 113 switches. Gating the third path 109 limits the DC current consumed by the third path 109 to a designed portion of a cycle of the DAC. The transfer gate 817 may alternatively be connected between VRef2 and Rpen, or multiple transfer gates 817 could be used. An alternative embodiment of the DAC system 100 having the transfer gate 817 may alternatively be connected between VRef2 and Rpen is illustrated in FIG. 12.

Figure 9:
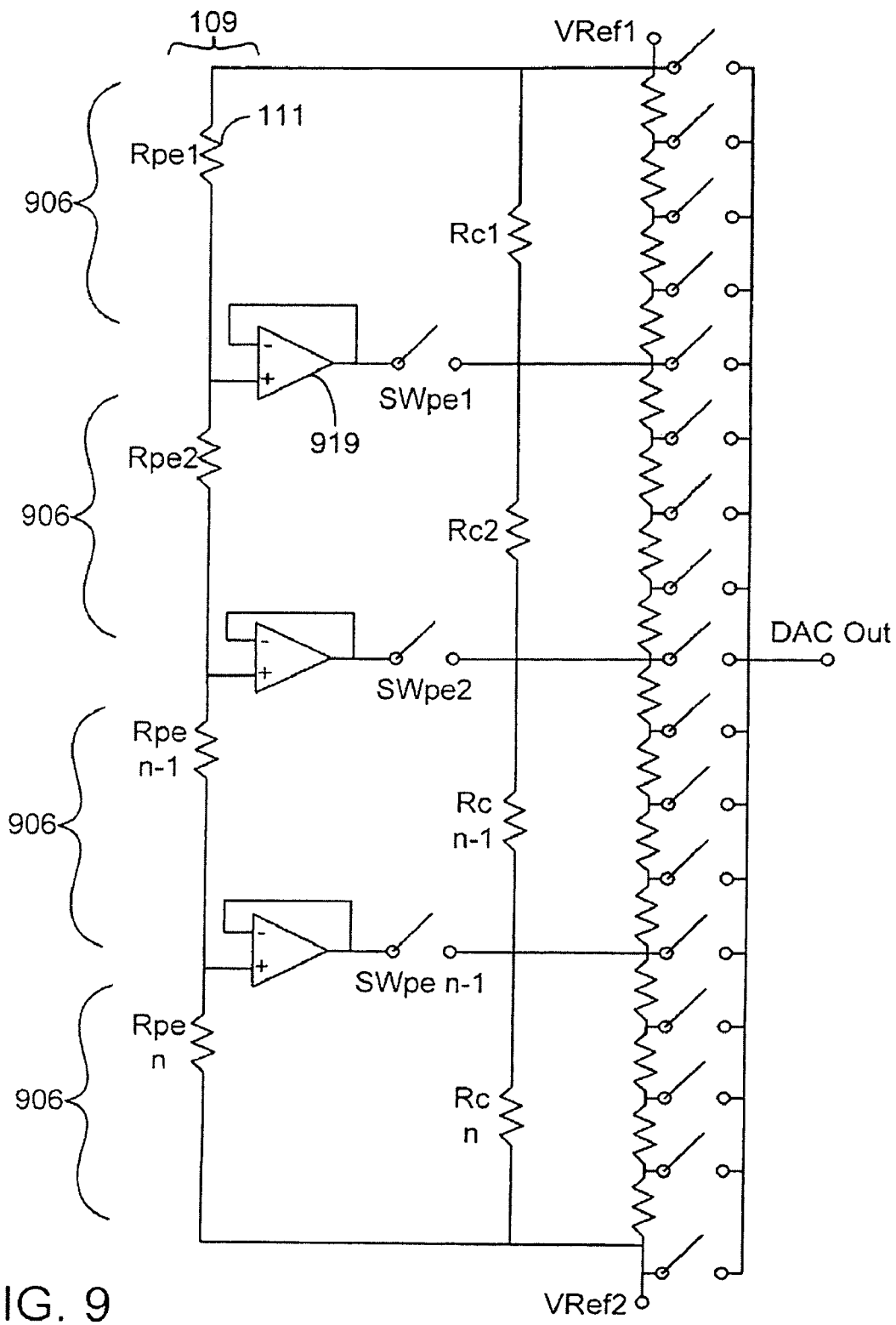
FIG. 9 illustrates another alternate exemplary embodiment of a DAC system.

FIG. 9 illustrates an alternate embodiment of the DAC system 100. In FIG. 9, the third path 109 includes an amplifier 919 in each segment 906. The amplifier 919 acts to amplify a signal on the third path 109 and allows the resistance of the Rpe resistors to be increased to conserve power in the third path 109. The embodiment of FIG. 9 illustrates and operational amplifier, however other amplification methods may be used.

Figure 10:
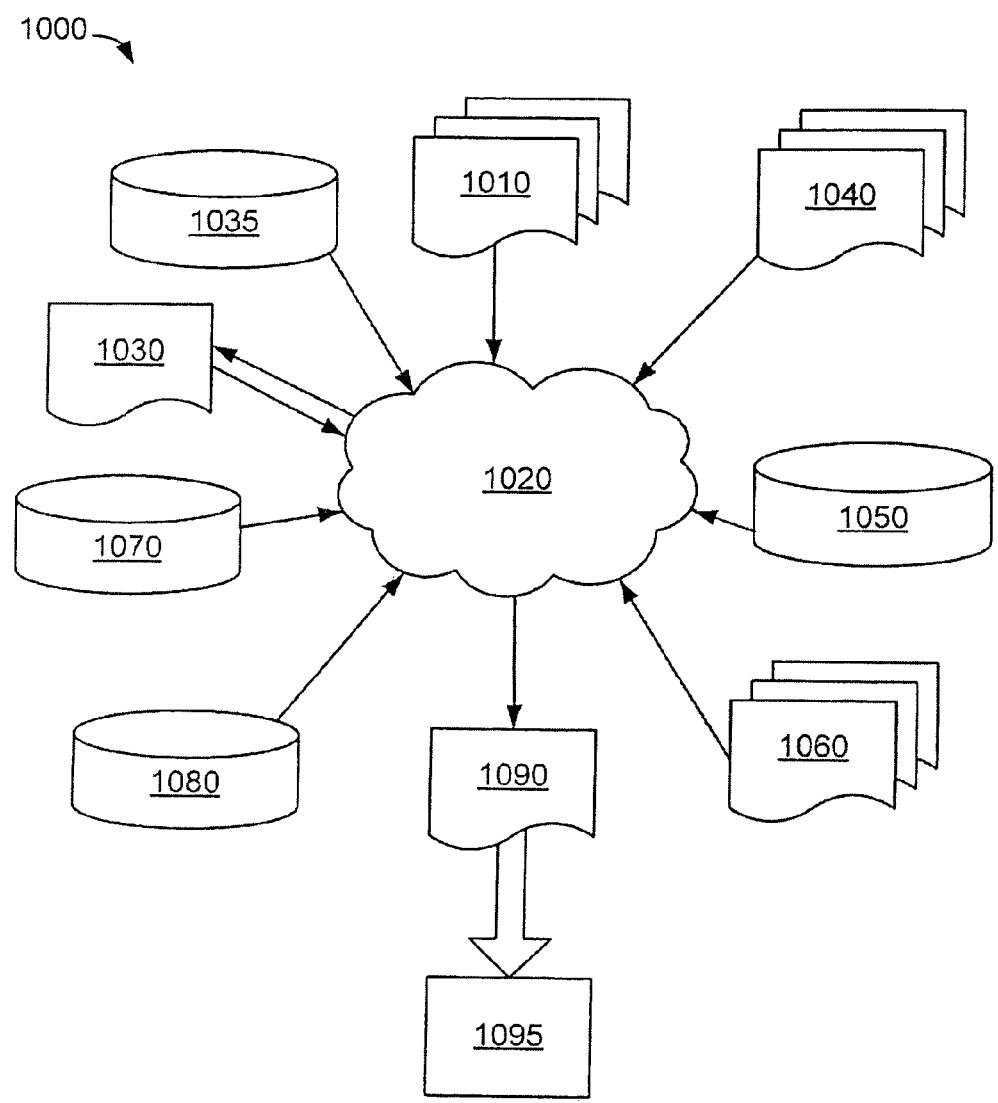
FIG. 10 illustrates a block diagram of an example of a design flow.

The embodiments discussed above may be incorporated into an integrated circuit (IC). FIG. 10 is a block diagram illustrating an example of a design flow 1000. Design flow 1000 may vary depending on the type of IC being designed. For example, a design flow 1000 for building an application specific IC (ASIC) will differ from a design flow 1000 for designing a standard component. Design structure 1010 is preferably an input to a design process 1020 and may come from an IP provider, a core developer, or other design company or may be generated by the operator of the design flow, or from other sources. Design structure 1010 comprises DAC system 100 in the form of schematics or HDL, a hardware-description language, (e.g., Verilog, VHDL, C, etc.). Design structure 1010 may be contained on one or more machine readable medium(s). For example, design structure 1010 may be a text file or a graphical representation of DAC system 100. Design process 1020 synthesizes (or translates) DAC system 100 into a netlist 1030, where netlist 1030 is, for example, a list of wires, transistors, logic gates, control circuits, I/O, models, etc., and describes the connections to other elements and circuits in an integrated circuit design and recorded on at least one of a machine readable medium. This may be an iterative process in which netlist 1030 is resynthesized one or more times depending on design specifications and parameters for the circuit.

Design process 1020 includes using a variety of inputs; for example, inputs from library elements 1035 which may house a set of commonly used elements, circuits, and devices, including models, layouts, and symbolic representations, for a given manufacturing technology (e.g., different technology nodes, 32 nm, 45 nm, 90 nm, etc.), design specifications 1040, characterization data 1050, verification data 1060, design rules 1070, and test data files 1080, which may include test patterns and other testing information. Design process 1020 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 1020 without deviating from the scope and spirit of the invention. The design structure of the invention embodiments is not limited to any specific design flow.

Design process 1020 preferably translates embodiments of the invention as shown in FIG. 2, along with any additional integrated circuit design or data (if applicable), into a second design structure 1090. Second design structure 1090 resides on a storage medium in a data format used for the exchange of layout data of integrated circuits (e.g. information stored in a GDSII (GDS2), GL1, OASIS, or any other suitable format for storing such design structures). Second design structure 1090 may comprise information such as, for example, test data files, design content files, manufacturing data, layout parameters, wires, levels of metal, vias, shapes, data for routing through the manufacturing line, and any other data required by a semiconductor manufacturer to produce embodiments of the invention as shown in FIG. 2. Second design structure 1090 may then proceed to a stage 1095 where, for example, second design structure 1090: proceeds to tape-out, is released to manufacturing, is released to a mask house, is sent to another design house, is sent back to the customer, etc.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A digital to analog converter (DAC) system comprising:
   a first segment, wherein a segment comprises:
   a first path including an array of resistors connected in series between a first reference voltage node and a second reference voltage node, wherein the array is connected to a first switch device disposed between nodes of the array and an output node;
   a second path including a first resistor and a capacitor, wherein the second path is connected in parallel with the first path and the capacitor is connected between a first node of the second resistor and a third reference voltage node; and
   a third path including a second resistor in series with a second switch device, wherein the third path is connected in parallel with the first path.

2. The system of claim 1, wherein the third path further comprises a third switch device connected in series between the first reference voltage and the second resistor of the first segment.

3. The system of claim 1, wherein the third path further comprises a third switch device connected in series between the second reference voltage and the second resistor.

4. The system of claim 1, wherein the third path further comprises an amplifier connected in series with the second resistor.

5. The system of claim 1, wherein the third path further comprises a capacitor connected between a first node of the second resistor and a third reference voltage node.

6. The system of claim 1, wherein the third path further comprises a third switch device connected in series between the first reference voltage and the second resistor of the first segment.

7. The system of claim 1, wherein the third path further comprises a third switch device connected in series between the second reference voltage and the second resistor.

8. The system of claim 1, wherein the third path further comprises an amplifier connected in series with the second resistor.

9. A design structure embodied in a machine readable medium used in a design process, the design structure comprising:
   an apparatus for converting digital signals to analog signals, the apparatus including a first segment, wherein a segment comprises:
   a first path including an array of resistors connected in series between a first reference voltage node and a second reference voltage node, wherein the array is connected to a first switch device disposed between nodes of the array and an output node; and
   a third path including a second resistor in series with a second switch device and a capacitor connected between a first node of the second resistor and a third reference voltage node, wherein the third path is connected in parallel with the first path.

10. The design structure of claim 9, wherein the third path further comprises a third switch device connected in series between the first reference voltage and the second resistor of the first segment.

11. The design structure of claim 9, wherein the third path further comprises an amplifier connected in series with the second resistor.

12. The design structure of claim 9, wherein the design structure comprises a netlist describing the apparatus for converting digital signals to analog signals.

13. The design structure of claim 9, wherein the design structure resides on storage medium as a data format used for the exchange of layout data of integrated circuits.

14. The design structure of claim 9, wherein the design structure includes at least one of test data files, characterization data, verification data, programming data, or design specifications.

* * * * *